United States Patent
Tepner et al.

(10) Patent No.: US 12,415,348 B2
(45) Date of Patent: Sep. 16, 2025

(54) PRINTING STENCIL FOR PRODUCING A STRUCTURE OF AN ELECTRONIC COMPONENT, IN PARTICULAR OF A PHOTOVOLTAIC SOLAR CELL, AND METHOD FOR PRODUCING A PRINTING STENCIL OF THIS TYPE

(71) Applicant: Fraunhofer-Gesellschaft zur Förderung der angewandten Forschung e.V., Munich (DE)

(72) Inventors: Sebastian Tepner, Freiburg (DE); Marius Singler, Friburg (DE); Andreas Lorenz, Freiburg (DE); Linda Ney, Freiburg (DE); Michael Linse, Freiburg (DE); Florian Clement, Freiburg (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 18/023,424

(22) PCT Filed: Jul. 30, 2021

(86) PCT No.: PCT/EP2021/071424
§ 371 (c)(1),
(2) Date: Feb. 27, 2023

(87) PCT Pub. No.: WO2022/043003
PCT Pub. Date: Mar. 3, 2022

(65) Prior Publication Data
US 2023/0311476 A1    Oct. 5, 2023

(30) Foreign Application Priority Data
Aug. 25, 2020  (DE) .................. 102020122181.9

(51) Int. Cl.
*B41F 19/00*  (2006.01)
*B41F 15/34*  (2006.01)
*H10F 71/00*  (2025.01)

(52) U.S. Cl.
CPC ............ *B41F 15/34* (2013.01); *B41F 19/005* (2013.01); *B41F 19/008* (2013.01); *H10F 71/137* (2025.01); *B41P 2215/50* (2013.01)

(58) Field of Classification Search
CPC .......... B41F 15/34; B41F 15/36; B41F 15/38; B41F 15/0881; B41F 19/005;
(Continued)

(56) References Cited

U.S. PATENT DOCUMENTS

2015/0352830 A1  12/2015  Shi
2016/0361942 A1  12/2016  Shibusawa
2017/0001430 A1   1/2017  Shibusawa

FOREIGN PATENT DOCUMENTS

CN    110816020        2/2020
CN    111088595 A  *  5/2020  ............... D01F 1/10
(Continued)

*Primary Examiner* — Christopher E Mahoney
*Assistant Examiner* — Marissa Ferguson-Samreth
(74) *Attorney, Agent, or Firm* — Volpe Koenig

(57) ABSTRACT

A printing form for producing a structure of an electronic component, in particular a photovoltaic solar cell, having a screen frame and a screen, which is in the form of a sheet-like textile and has a multiplicity of elongate screen elements. The screen is arranged in the screen frame and the screen has at least one printing region which a printing paste can permeate and at least one barrier region which the printing paste cannot permeate. The elongate screen elements are made from glass fiber, carbon fiber and/or carbon nanotubes.

12 Claims, 2 Drawing Sheets

(58) Field of Classification Search
CPC ............... B41F 19/008; B41P 2215/50; H01L 31/1876; H05K 3/1225
See application file for complete search history.

(56) References Cited

FOREIGN PATENT DOCUMENTS

| | | | | |
|---|---|---|---|---|
| DE | 29708329 | | 9/1997 | |
| DE | 102019122126 | | 2/2021 | |
| EP | 3000612 | | 3/2016 | |
| JP | H10315647 | | 12/1998 | |
| JP | 2017013330 | | 1/2017 | |
| JP | 2017091741 | * | 5/2017 | |
| WO | WO-9813201 A1 | * | 4/1998 | .............. B41M 1/12 |

* cited by examiner

PRINTING STENCIL FOR PRODUCING A STRUCTURE OF AN ELECTRONIC COMPONENT, IN PARTICULAR OF A PHOTOVOLTAIC SOLAR CELL, AND METHOD FOR PRODUCING A PRINTING STENCIL OF THIS TYPE

CROSS-REFERENCE TO RELATED APPLICATIONS

This application is the U.S. National Phase of PCT Appln. No. PCT/RP2021/071424, filed Jul. 30, 2021, which claims the benefit of German Patent Appln. No. 102020122181.9, filed Aug. 25, 2020, the entire disclosures of which are incorporated by reference herein.

TECHNICAL FIELD

The invention relates to a printing form for producing a structure of an electronic component, in particular a photovoltaic solar cell, and to a method for producing such a printing form. The invention furthermore relates to a method for applying a printing paste to the surface of an electronic component, in particular a photovoltaic solar cell, by means of a printing form.

BACKGROUND

For the production of electronic components, for example semiconductor components or circuit boards, but in particular for the production of photovoltaic solar cells, in many production methods it is necessary to apply a printing paste in a predefined, typically linear, in particular rectilinear structure. The printing paste can comprise metallic particles for forming a metallic line structure and/or contacting structure of the component. In addition or as an alternative, the printing paste may also comprise substances for treating the semiconductor, in particular dopant elements for forming doping regions in the semiconductor material of the component.

The use of screen printing to apply a printing paste to one or more local regions of a surface of the component in order to form the structure mentioned above is known. In this case, use is made of a printing form which comprises a screen frame and a screen. The screen is in the form of a sheet-like textile. On the screen there is arranged a stencil, which defines a printing region which the printing paste can permeate through openings, or regions cut out from the stencil, and also defines a barrier region which the printing paste cannot permeate and which is covered by the stencil. The screen in the form of a sheet-like textile has multiple elongate screen elements which typically run parallel to and spaced apart from one another, or run perpendicularly to one another.

To apply the printing paste to the surface of the electronic component, the printing paste is applied at least in the printing region of the printing form. The screen prevents the printing paste from passing through the printing form immediately upon application thereto. Only by exerting an additional force, typically by means of a doctor blade, is the printing paste applied to the surface of the component through the printing form, and thus in particular through the screen, in the printing region.

There is an increasing requirement for the formation of line-like structures with ever smaller widths. The channels that are defined by the printing region and are intended to form the line-like structures must therefore have a correspondingly small width in accordance with this requirement. A disadvantage of the printing forms already known is that, as a result of the structure of the printing form per se, it is not possible to go below a minimum channel width, since otherwise irregular or non-cohesive line-like structures of the printing paste are applied.

SUMMARY

The present invention is thus based on the object of providing a printing form which makes it possible to form line-like structures with a small width from printing paste.

This object is achieved by a printing form, a method for producing a printing form, and a method for applying a printing paste all having one or more of the features described herein. Advantageous configurations are found below and in the claims.

The printing form according to the invention is preferably made by a corresponding method for producing a printing form, in particular a preferred embodiment thereof. The method according to the invention for producing a printing form is preferably designed to produce a printing form according to the invention, particularly preferably an advantageous embodiment thereof.

The printing form according to the invention for producing a structure of an electronic component, in particular a photovoltaic solar cell, has a screen frame and a screen, which is in the form of a sheet-like textile and has a multiplicity of elongate screen elements. The screen is arranged in the screen frame, preferably with application of a tensile stress. The screen has at least one printing region which the printing paste can permeate and at least one barrier region which the printing paste cannot permeate.

It is essential that the elongate screen elements are in the form of glass fibers, carbon fibers and/or carbon nanotubes.

The invention is based on the applicant's finding that the tensile stress with which the elongate screen elements are arranged in the screen frame is an essential parameter for the minimum possible channel width of a printing region of the printing form.

If, therefore, a material that enables a particularly high tensile stress is used for the elongate screen elements, linear elements with a particularly small width can be formed. By experiments and calculations, the applicant has succeeded in reducing the number of screen elements per section (typically specified in screen elements per inch) and the diameter of the screen elements by adapting the material from which the screen elements are produced to the extent that a high tensile stress specific to the material is present.

The applicant's investigations show that in particular a maximum fabric tension in the screen that is in the form of a sheet-like textile, and thus also the print quality of applied structures with a small channel width, is increased in that the elongate screen elements are in the form of glass fibers, carbon fibers and/or carbon nanotubes.

Screen elements of glass fiber and carbon fiber make it possible to achieve tensile stresses in the range of 4900 megapascals. If the elongate screen elements are in the form of carbon nanotubes, tensile stresses of 63 000 megapascals can be achieved.

The screen that is in the form of a sheet-like textile is therefore preferably arranged in the screen frame with a tensile stress greater than 15 N/cm, preferably greater than 20 N/cm, most preferably greater than 25 N/cm.

The applicant's investigations show that the increase in the tensile stress resulting from the selection of the material of the screen elements in the case of the printing form according to the invention enables a considerable reduction in the diameter of the screen elements. This is surprising, since the diameter of the screen elements is a parameter which, when increased, enables larger tensile stresses. In the case of printing forms that are already known, a desired increase in the fabric tension, i.e. the tensile stress of the elongate screen elements, was achieved by increasing the diameter of the screen elements. The selection of the material for the printing form according to the invention, by contrast, makes it possible to achieve high fabric tensions with nevertheless small diameters.

The applicant's investigations show that the printing form is preferably formed with the following tensile stresses and diameters of the elongate screen elements:

| Material of the elongate screen elements | Diameter of the screen elements | Tensile stress |
|---|---|---|
| Glass fiber | 1 μm to 12 μm | 1200 megapascals to 6000 megapascals |
| Carbon | 1 μm to 12 μm | 1200 megapascals to 6000 megapascals |
| Carbon nanotubes | 50 nm to 2 μm | 6001 megapascals to 63000 megapascals |

The preferred ranges stated above for the parameters mentioned enable small channel widths and thus small widths of the line-like structures formed by means of the printing paste.

The applicant's investigations show that preferably, when the elongate screen elements are made from glass fiber and/or from carbon, a density of the screen elements in the range of 50 screen elements per inch to 3000 screen elements per inch is used. When the elongate screen elements are made from carbon nanotubes, there is preferably a range of 50 screen elements per inch to 10 000 screen elements per inch.

In particular, it is advantageous if there are between 280 screen elements and 950 screen elements per inch when the elongate screen elements are made from glass fiber or carbon, and between 70 screen elements and 2025 screen elements per inch when the elongate screen elements are made from carbon nanotubes.

The densities mentioned above for the screen elements are preferably formed at least in the printing region of the printing form, further preferably in the printing region and barrier region.

As described above, the printing form according to the invention is suitable in particular for producing elongate, linear structures from printing paste. Advantageously, the printing region is therefore at least partially in the form of an elongate channel opening, in particular a linear channel opening, preferably a rectilinear channel opening, preferably with a longitudinal extent and a channel width (b). The channel width (b) is preferably smaller than 40 μm, preferably smaller than 20 μm, particularly preferably smaller than 10 μm.

The screen that is in the form of a sheet-like textile preferably has at least one first group of elongate screen elements, wherein the elongate screen elements of this group are arranged parallel to one another and further preferably equidistantly from one another. Preferably, when at least one rectilinear channel opening is provided in the printing region, the channel opening is arranged at an angle in relation to the longitudinal axis of the channel opening that is not equal to 0°. In particular, it is advantageous to provide an angle and a maximum channel width as described in DE 10 2019 122 126.9. That document is incorporated in its entirety by reference. In particular, it is advantageous for the at least one rectilinear channel described above of the printing region to form an angle with a screen element of the printing region with a tolerance of +/−0.1°, wherein the angle is selected from the following group: 11.31°, 14.04°, 18.44°, 26.57°, 45°, 33.69°, in particular 11.31°, 14.04°, 18.44°, 26.57°, 33.69°.

This makes it possible to achieve an advantageous reduction in the nodes of screen elements within the channel opening, as is known from DE 10 2019 122 126.9.

Advantageously, the screen, in the form of a sheet-like textile, of the printing form has at least one second group of elongate screen elements, wherein the elongate screen elements of the second group are arranged parallel to one another and preferably equidistantly from one another. In particular, it is advantageous for the screen elements of the first and the second group to form an angle in the range of 30° to 150°, preferably 60° to 120°, particularly preferably 85° to 95°, preferably 90°.

In particular, it is advantageous for the elongate screen elements of the printing form to be assigned fully to the first and the second group mentioned above.

The elongate screen elements are thus preferably arranged parallel or perpendicularly to one another in pairs.

The applicant's investigations have shown that preferably, in the printing region, an area ratio SUI resulting from the ratio of the free surface area in the printing region to the surface area covered by the elongate screen elements in the printing region is greater than 0.5, preferably greater than 0.75, in particular greater than 1. This results in an advantageous opening ratio in order to apply printing paste to the surface of the component through the screen with an advantageously low pressure, in particular by means of a doctor blade.

As described above, the printing form according to the invention has a multiplicity of elongate screen elements. It is within the scope of the invention for the screen elements to be connected to one another and in particular be made from one or more elongate, pliant screen element base elements by means of deflection in the region of the screen frame.

The object stated at the outset is furthermore achieved by a method for producing a printing form having a screen frame and a sheet-like screen with a multiplicity of elongate screen elements and at least one printing region which printing paste can permeate and one barrier region which printing paste cannot permeate.

It is essential for the elongate screen elements to be in the form of glass fibers and/or carbon fibers and/or carbon nanotubes and to be joined to form a pliant sheet-like textile, in particular a fabric or cross-laid structure, in a bonding step. The sheet-like textile is arranged by way of the edge region on the screen frame and connected to the screen frame, preferably with application of a tensile stress, in a tensioning step.

This results in the advantages mentioned in relation to the printing form according to the invention. In particular, as described above, it is advantageous for the textile to be arranged in the screen frame with a tensile stress greater than 15 N/cm, preferably greater than 20 N/cm, most preferably greater than 25 N/cm.

The tensile stress of the textile is preferably obtained by arranging the elongate screen elements under tensile stress in particular in a screen frame used for the production and then fixing them, particularly preferably by means of the material from which the barrier region is made. In this advantageous embodiment, it is thus not absolutely necessary for the tensile stress of the textile to be produced by clamping it in a frame, as for example the screen frame of the printing form. The fixing by means of the fixing material, in particular the material of a stencil defining the barrier region, makes it possible to fix the tensile stress of the textile even without an external frame.

In an alternative preferred configuration, the tensile stress of the textile is obtained by arranging the screen under tensile stress in the frame and fixing it to the frame.

In a further advantageous configuration, the tensile stress of the textile is formed by a combination of clamping the textile in the screen frame of the printing form and fixing the textile with a material, preferably by means of the material from which the barrier region is made, in particular the material of a stencil defining the barrier region.

Advantageously, in a coating step, a barrier layer which printing paste cannot permeate, preferably a barrier layer containing ethylene-propylene-diene rubber, which is arranged on the screen is effected. In the structuring step, an opening, particularly preferably an elongate channel opening, for the printing region is preferably made in the barrier layer. The opening is preferably formed by means of a laser, in particular by means of laser ablation. This enables a precise and at the same time cost-effective formation of the one or more printing regions.

This opening thus forms a printing region which the printing paste can permeate.

Advantageously, in the printing stencil, at least one channel opening is formed which has a line-like, particularly preferably rectilinear, form and has a channel width which is smaller than 40 μm, preferably smaller than 20 μm, most preferably smaller than 10 μm.

Advantageously, in an opening step, a stencil blank, in particular a thin-walled metal sheet, is processed by means of a laser to form a printing stencil, wherein an elongate channel opening, preferably a rectilinear channel opening, is made in the stencil blank, and the printing stencil is arranged on the screen in a mounting step.

In this advantageous embodiment, the printing region is thus defined in the printing stencil before the printing stencil is arranged on the screen. This avoids damage to the screen when forming the one or more printing regions.

The object stated at the outset is furthermore achieved by a method for applying a printing paste to the surface of an electronic component, in particular a photovoltaic solar cell, by means of a printing form, wherein printing paste is applied to a substrate of the electronic component through the printing form by means of a doctor blade. It is essential that use is made of a printing form according to the invention, in particular a preferred embodiment thereof.

This makes it possible advantageously to apply line-like structures of printing paste with a small width to a surface of the electronic component.

BRIEF DESCRIPTION OF THE DRAWINGS

Further advantageous features and preferred embodiments are explained below on the basis of exemplary embodiments and the figures, in which.

DETAILED DESCRIPTION

The figures show schematic illustrations that are not true to scale. The same reference signs in the figures denote elements that are the same or have the same effect.

Figure 1:
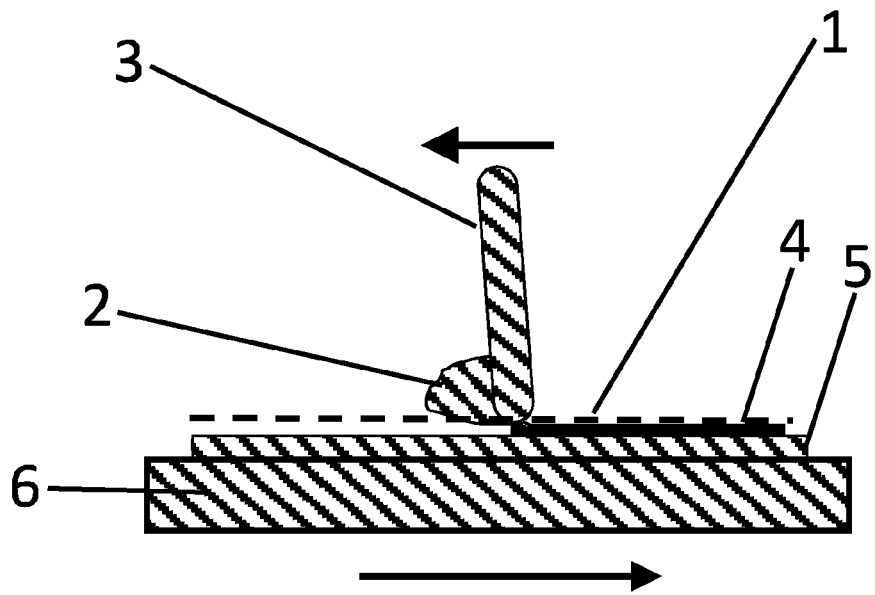
FIG. 1 shows a first embodiment of a screen printing device with a first exemplary embodiment of a printing form according to the invention for flatbed screen printing.

FIG. 1 illustrates a first exemplary embodiment of a screen printing device in a side view. The device is designed to carry out a flatbed screen printing method.

The device has a first exemplary embodiment, in the form of a screen printing form 1, of a printing form according to the invention which is in the form of a flatbed screen printing form. The screen printing form 1 has a form which a screen printing paste 2 partially can permeate and which the screen printing paste 2 partially cannot permeate, in order to form the predefined structure. This is explained in more detail with reference to FIGS. 3 and 4.

In the present case, the printing paste 2 is a printing paste which contains metal particles and serves, after heat treatment, to form a metal contacting structure in the form of a contacting grid, known per se, on the front side of an electronic component in the form of a photovoltaic solar cell.

The device has a doctor blade 3, which can be moved along the direction indicated by the arrow shown above the doctor blade by motorized means, which are not illustrated. As a result, the screen printing paste 2 is spread over the screen printing form 1 and penetrates the screen printing form 1 at the locations it can permeate, so that the structure 4 of screen printing paste is applied to a substrate 5.

In the present case, the substrate 5 is in the form of a silicon wafer, which already has p-doped and n-doped regions for forming emitter and base. The substrate 5 thus constitutes a solar cell precursor; to finish the solar cell it is still necessary to arrange the metal contacting structure on the front side of the semiconductor substrate 5.

The device has a feed unit for feeding and discharging semiconductor substrates, which feed unit has a conveyor belt (not illustrated) on which multiple shuttles are arranged. By way of example, FIG. 1 illustrates a shuttle 6 with a substrate 5 lying thereon.

Figure 2:
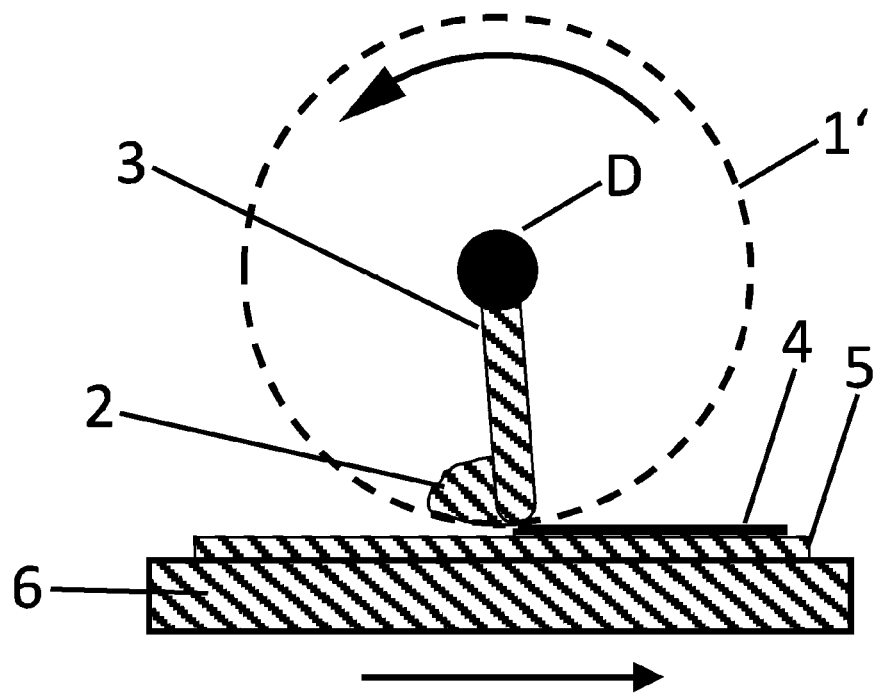
FIG. 2 shows a second embodiment of a screen printing device with a second exemplary embodiment of a printing form according to the invention for rotary screen printing.

FIG. 2 illustrates, as alternative embodiment, a second of a printing device with a second exemplary embodiment, in the form of a screen printing form 1', of a printing form according to the invention. This printing device is designed to carry out a rotary screen printing method. A comparison of FIGS. 1 and 2 shows that some elements have identical forms and arrangements. However, it is essential that, in the second exemplary embodiment according to FIG. 2, the screen printing form 1' is in the form of a round screen with a cylindrical shape. The doctor blade 3 is arranged on the inside of the cylindrical screen printing form 1', with the result that the printing paste 2 is pressed outward through the screen printing form from the inside of the screen printing form 1', in order to form the structure 4 of printing paste on the substrate 5.

To that end, the screen printing form 1' in the form of a round screen has an axis of rotation 1a and can be rotated in the direction indicated by the circular-arc arrow by motorized means. The axis of rotation 1a is thus perpendicular to the plane of the drawing in FIG. 2.

At the same time, by means of the shuttle 6, the semiconductor substrate 5 is moved in the direction illustrated by the straight-line arrow in such a way that the relative speed between the substrate 5 and the lateral surface of the screen printing form 1' at the point of contact between the screen printing form 1' and the substrate 5 is zero or at least negligibly small.

The doctor blade 3, by contrast, does not perform a rotational movement, with the result that the printing paste 2 on the inside of the screen printing form 1' is pressed against the doctor blade 3 on account of the rotational movement of the screen printing form 1' and applied to the substrate 5 through the screen printing form by means of the doctor blade.

The screen printing forms 1 and 1' have fundamentally the same construction; it is merely the case that the screen printing form 1 has a planar, rectangular shape whereas the shape of the screen printing form 1' corresponds to the lateral surface of a cylinder.

The screen printing forms 1 and 1' thus both constitute exemplary embodiments of a printing form according to the invention which has a screen frame in which a sheet-like textile in the form of a screen printing fabric is arranged as screen under tensile stress. In the case of the screen printing form according to FIG. 1, the screen frame and also the screen are rectangular. In the case of the screen printing form according to FIG. 2, the screen is in the form of the lateral surface of a cylinder. The screen frame has annular elements arranged at the two edges of the lateral-surface-shaped screen. The fabric is preferably adhesively bonded to the annular elements. In the case of the screen printing form according to FIG. 1, the tensile stress is substantially formed by clamping the screen into the screen frame. In the case of the screen printing form according to FIG. 2, the tensile stress is substantially formed by using the stencil to fix the screen printing fabric. In an alternative configuration, webs are additionally provided between the annular elements, with the result that the tensile stress is obtained by clamping the screen.

In both screen printing forms, a stencil is used to form a plurality of elongate, rectilinear openings, which are rectangular in the present case, with the result that these openings form a printing region which printing paste can permeate, whereas the stencil itself forms a barrier region which the printing paste cannot permeate.

Figure 3:
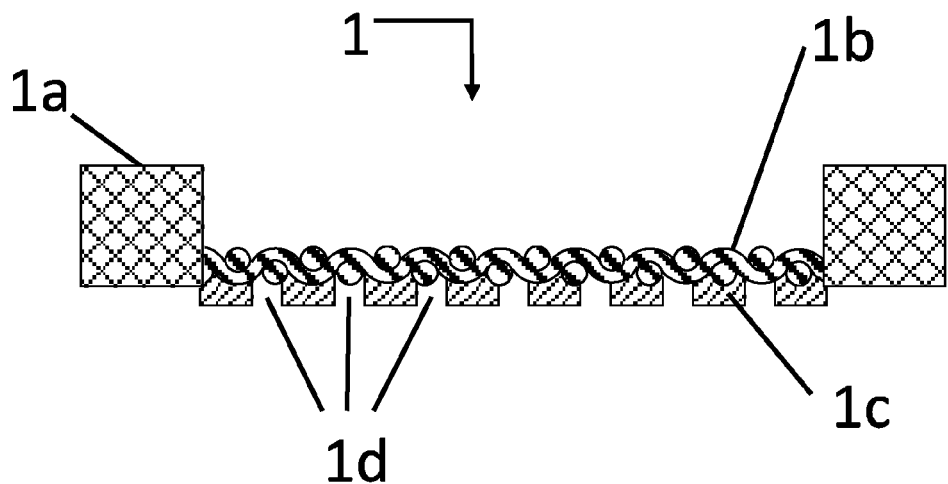
FIG. 3 shows a sectional illustration through the first exemplary embodiment of a printing form according to the invention of the screen printing device according to FIG. 1.

FIG. 3 illustrates a cross section through the screen printing form 1 of the device according to FIG. 1. The screen printing form 1 has the rectangular frame 1a, in which the sheet-like textile in the form of a screen printing fabric 1b is tensioned. The screen printing fabric 1b has a multiplicity of elongate screen elements which are in the form of fabric elements and are arranged in a first element direction and a perpendicular element direction. According to FIG. 3, the first element direction is perpendicular to the plane of the drawing and correspondingly the second element direction according to the illustration in FIG. 3 is parallel to the plane of the drawing.

The stencil 1c, which is in the form of an emulsion as is known per se, is arranged on the screen printing fabric 1b. The stencil 1c has a multiplicity of openings which are each in the form of a rectilinear, elongate channel 1d. The channels of the screen printing form 1 run parallel to one another and perpendicularly to the plane of the drawing according to FIG. 3 and in the present case have identical widths. By way of example, three channels 1d are denoted in FIG. 3.

If then, in FIG. 3, the doctor blade is used to press screen printing paste onto the screen printing form 1 from above, the screen printing paste can penetrate the screen printing form only in the region of the channels 1d, so that a structure of screen printing paste, corresponding to the positive shape of the channels, is created on a substrate lying below FIG. 3, which substrate consists of a corresponding multiplicity of parallel lines of screen printing paste arranged next to one another.

Figure 4:
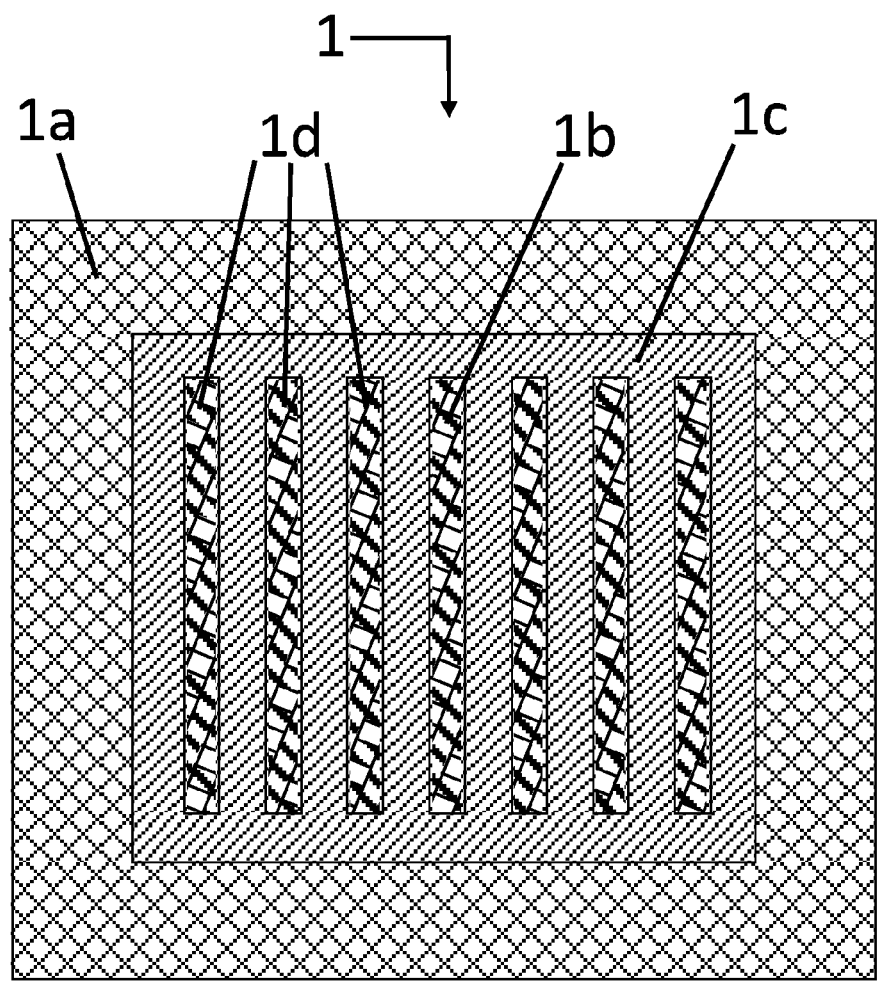
FIG. 4 shows a plan view from above of the printing form according to FIG. 3.

FIG. 4 shows a rear view from underneath of the screen printing form 1 according to FIG. 3. What is schematically illustrated is that, in the region of the openings of the stencil 1c, that is to say in the region of the channels 1d, the screen printing form is not completely open, since fabric elements of the screen printing fabric 1b run underneath the channels 1d.

In the case of the printing form illustrated in FIG. 1, the elongate screen elements are made from glass fiber with a fiber diameter of 5 μm and a fiber density of 1500 filaments per inch. The tensile stress is 4000 megapascals. In an alternative configuration of this exemplary embodiment, the elongate screen elements are made from carbon fibers with the parameters mentioned above.

The printing form according to FIG. 2 has elongate screen elements made from carbon nanotubes. The diameter of the screen elements is 0.5 μm with a fiber density of 5000 screen elements per inch. The screen elements are arranged on the screen frame with a tensile stress of 40 000 megapascals.

This results in the advantage that small channel widths can be realized. In the present case, the channel widths are 10 μm in the first exemplary embodiment and 5 μm in the second exemplary embodiment.

The invention claimed is:

1. A printing form for producing a structure of an electronic component, the printing form comprising:
a screen frame and a screen formed as a textile sheet and having a multiplicity of elongate screen elements, the screen is arranged in the screen frame and the screen has at least one printing region which is permeable for a printing paste and at least one barrier region which is impermeable to the printing paste,
wherein the elongate screen elements are made from carbon nanotubes with a diameter ranging between 50 nm and 2 μm, and
wherein the textile sheet is arranged in the screen frame with a tensile stress ranging between 6,001 Megapascals and 63,000 Megapascals.

2. The printing form as claimed in claim 1, wherein a diameter of the screen elements is smaller than 10 μm.

3. The printing form as claimed in claim 1, wherein the screen frame has a joining region configured to materially bond the textile sheet under tension in an edge region at least partially to the screen frame.

4. The printing form as claimed in claim 1, wherein the at least one printing region at least partially comprises an elongate channel opening with a longitudinal axis and a channel width (w), and the channel width (w) is smaller than 40 μm.

5. The printing form as claimed in claim 4, wherein at least one of the screen elements is arranged at an angle in relation to a longitudinal axis of the elongate channel opening that is not equal to 0°.

6. The printing form as claimed in claim 1, wherein, in the at least one printing region, an area ratio SUI resulting from a ratio of a free surface area in the printing region to a surface area covered by the elongate screen elements in the at least one printing region is greater than 0.5.

7. The printing form as claimed in claim 1, wherein the elongate screen elements are arranged parallel or perpendicularly to one another in pairs.

8. A method for applying a printing paste to a surface of an electronic component using a printing form, the method comprising: providing the printing form according to claim 1; and applying a printing paste to a substrate of the electronic component through the printing form by a doctor blade.

9. A method for producing a printing form with a screen frame and a screen having a multiplicity of elongate screen elements and at least one printing region which is permeable to printing paste and one barrier region which is impermeable to printing paste, the method comprising:
   forming the elongate screen elements from carbon nanotubes that have a diameter ranging from 50 nm to 2 μm and are joined in a bonding step to form a pliant textile sheet,
   arranging the textile sheet with an edge region thereof on the screen frame and connecting the textile sheet to the screen frame in a tensioning step, and
   arranging the textile sheet in the screen frame with a tensile stress ranging between 6,001 Megapascals and 63,000 Megapascals.

10. The method as claimed in claim 9, further comprising, in a coating step, arranging a barrier layer which is impermeable to the printing paste on the screen and, in a structuring step, making an elongate channel opening in the barrier layer in order to form the at least one printing region which the printing paste can permeate.

11. The method as claimed in claim 10, wherein the channel opening has a channel width and the channel width is smaller than 40 μm.

12. The method as claimed in claim 9, further comprising in a separating step, processing a stencil blank using a laser to form a printing stencil, wherein the elongate channel opening is made in the stencil blank, and in a mounting step, arranging the printing stencil in the at least one printing region of the screen.

* * * * *